(12) United States Patent
Takada et al.

(10) Patent No.: US 6,621,273 B2
(45) Date of Patent: Sep. 16, 2003

(54) VOLTAGE MEASUREMENT APPARATUS

(75) Inventors: Masahiro Takada, Aichi (JP); Naohisa Morimoto, Aichi (JP)

(73) Assignees: Matsushita Electric Industrial Co., Ltd., Osaka (JP); Toyota Jidosha Kabushiki Kaisha, Aichi (JP)

( * ) Notice: Subject to any disclaimer, the term of this patent is extended or adjusted under 35 U.S.C. 154(b) by 162 days.

(21) Appl. No.: 10/000,406

(22) Filed: Oct. 31, 2001

(65) Prior Publication Data

US 2002/0070733 A1 Jun. 13, 2002

(30) Foreign Application Priority Data

Oct. 30, 2000 (JP) .......................................... 2000-334026

(51) Int. Cl.[7] ............................................. G01N 27/416
(52) U.S. Cl. ........................................ 324/433; 320/166
(58) Field of Search ................................. 324/429, 426, 324/433; 320/116, 118, 119, 166, 167

(56) References Cited

U.S. PATENT DOCUMENTS 5,281,920 A * 1/1994 Wurst

FOREIGN PATENT DOCUMENTS

| EP | 0 990 913 A1 | 4/2000 |
| JP | 11-248755 | 9/1999 |

* cited by examiner

*Primary Examiner*—Edward H. Tso
(74) *Attorney, Agent, or Firm*—Snell & Wilmer, LLP

(57) ABSTRACT

A voltage measurement apparatus is provided for measuring a voltage of each of N power sources connected in series. The apparatus includes N capacitance elements provided respectively corresponding to the N power sources, and connected in series, a first switching section for simultaneously applying a voltage of each power source to one of the N capacitance elements corresponding to said power source, a voltage measurement section for measuring a voltage of each capacitance element, and a second switching section for sequentially connecting each capacitance element to the voltage measurement section.

7 Claims, 5 Drawing Sheets

VOLTAGE MEASUREMENT APPARATUS

BACKGROUND OF THE INVENTION

1. Field of the Invention

The present invention relates to a voltage measurement apparatus for measuring, under insulative conditions, the voltage of each of a plurality of power sources connected in series. More particularly, the present invention relates to a voltage measurement apparatus suited to measuring the voltage of each cell in a high-voltage battery including a plurality of cells connected in series, in which the battery is used as a power source in an electric vehicle, such as a HEV (hybrid electric vehicle).

2. Description of the Related Art

A high-voltage battery, which is used as a power source in a HEV, includes a number of cells connected in series so as to obtain a high voltage. For such a high-voltage battery, abnormal conditions, the state of charge, and the like are preferably detected by measuring the voltage of each cell. However, since a high-voltage battery uses a number of cells, it is not easy to measure the voltage of every cell. Typically, a number of cells connected in series are grouped into a plurality of battery modules each including a predetermined number of cells, and the voltage of each battery module is then measured.

Further, an attempt is typically made to simplify the configuration of the measurement circuit for measuring the voltage of each battery module, in which all battery modules are sequentially connected via a switching circuit to a single voltage measurement circuit and the voltage of each battery module is measured sequentially.

A high-voltage battery used as a power source in a HEV is mounted on the HEV while being insulated from the chassis in order to avoid danger. Therefore, a voltage measurement apparatus measures the absolute voltage of each battery module in the high-voltage battery. In contrast, a control system, which controls charge and discharge of a high-voltage battery, uses the potential of a chassis as a reference potential.

Japanese Laid-Open Publication No. 11-248755 discloses a voltage measurement apparatus having a simple circuit configuration which measures the voltage of each battery module in a high-voltage battery including a plurality of cells connected in series. In this apparatus, a switching circuit including a combination of two multiplexers is used, and the voltage of each battery module is sequentially applied to a provided condenser, corresponding to each battery module. Further, all of the condensers are sequentially connected to a single voltage measurement circuit.

The above-described voltage measurement apparatus can measure the voltage of each battery module with high precision, in which the number of expensive analog switches used in a switching circuit can be significantly reduced, thereby simplifying the overall circuit configuration, and increasing economy.

In a high-voltage battery used in a HEV, the voltage of each of a plurality of battery modules is constantly measured at predetermined times during the time when the HEV is driven. In this case, during the time when the HEV is driven, a current flowing through each module varies from moment to moment. Therefore, the voltage value of each battery module varies depending on the time when the voltage measurement is conducted. In extreme cases, when charge and discharge of a high-voltage battery are switched, the current value of each battery module may be dramatically changed.

As described above, the current value of each battery module varies depending on the time when the voltage measurement is conducted. In this case, the voltage measurement apparatus disclosed in the above-described publication, or the like is unlikely to accurately measure the voltage of each battery module. As a result, the measured voltage of each battery module is inaccurate, which leads to an error in detection of an abnormal battery, a reduction in control precision of charge and discharge, or the like.

SUMMARY OF THE INVENTION

According to an aspect of the present invention, a voltage measurement apparatus for measuring a voltage of each of N power sources connected in series, includes N capacitance elements provided respectively corresponding to the N power sources, and connected in series, a first switching section for simultaneously applying a voltage of each power source to one of the N capacitance elements corresponding to said power source, a voltage measurement section for measuring a voltage of each capacitance element, and a second switching section for sequentially connecting each capacitance element to the voltage measurement section.

In one embodiment, the first switching section includes two sampling switches provided between terminals of a circuit including the N power sources connected in series, and corresponding terminals of a circuit including the N capacitance elements connected in series, and N−1 sampling switches, each provided between an interface portion between a corresponding pair of power sources connected in series, and an interface portion between a corresponding pair of capacitance elements connected in series. The N+1 sampling switches are simultaneously switched ON or OFF.

In one embodiment of this invention, the second switching section includes a first multiplexer including a switch connected between a positive-side terminal of each odd-numbered capacitance element of the N capacitance elements connected in series, and one of a pair of input terminals of the voltage measurement section, and a second multiplexer including a switch connected between a positive-side terminal of each even-numbered capacitance element of the N capacitance elements connected in series, and the other of the pair of input terminals of the voltage measurement section. One of the switches in each multiplexer is simultaneously selected and switched ON or OFF in such a manner that the N capacitance elements are sequentially connected to the voltage measurement section.

In one embodiment of this invention, the voltage measurement section is connected to a polarity correction section for inverting a polarity of a voltage to be measured.

In one embodiment of this invention, the each capacitance element includes a pair of capacitance sub-elements. The voltage measurement section is of a differential input type. The second switching section includes a third multiplexer for selectively connecting an intermediate connecting point between the pair of capacitance sub-elements connected to the voltage measurement section to a reference potential of the voltage measurement section.

In one embodiment of this invention, each sampling switch in the first switching section includes a semiconductor relay element for driving a MOS transistor using a light signal.

In one embodiment of this invention, each switch in the second switching section includes a semiconductor relay element for driving a MOS transistor using a light signal.

Thus, the invention described herein makes possible the advantages of providing a voltage measurement apparatus capable of measuring the coincident voltages of all of a plurality of power sources connected in series, without the influence of variations in the current value.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

Figure 1:
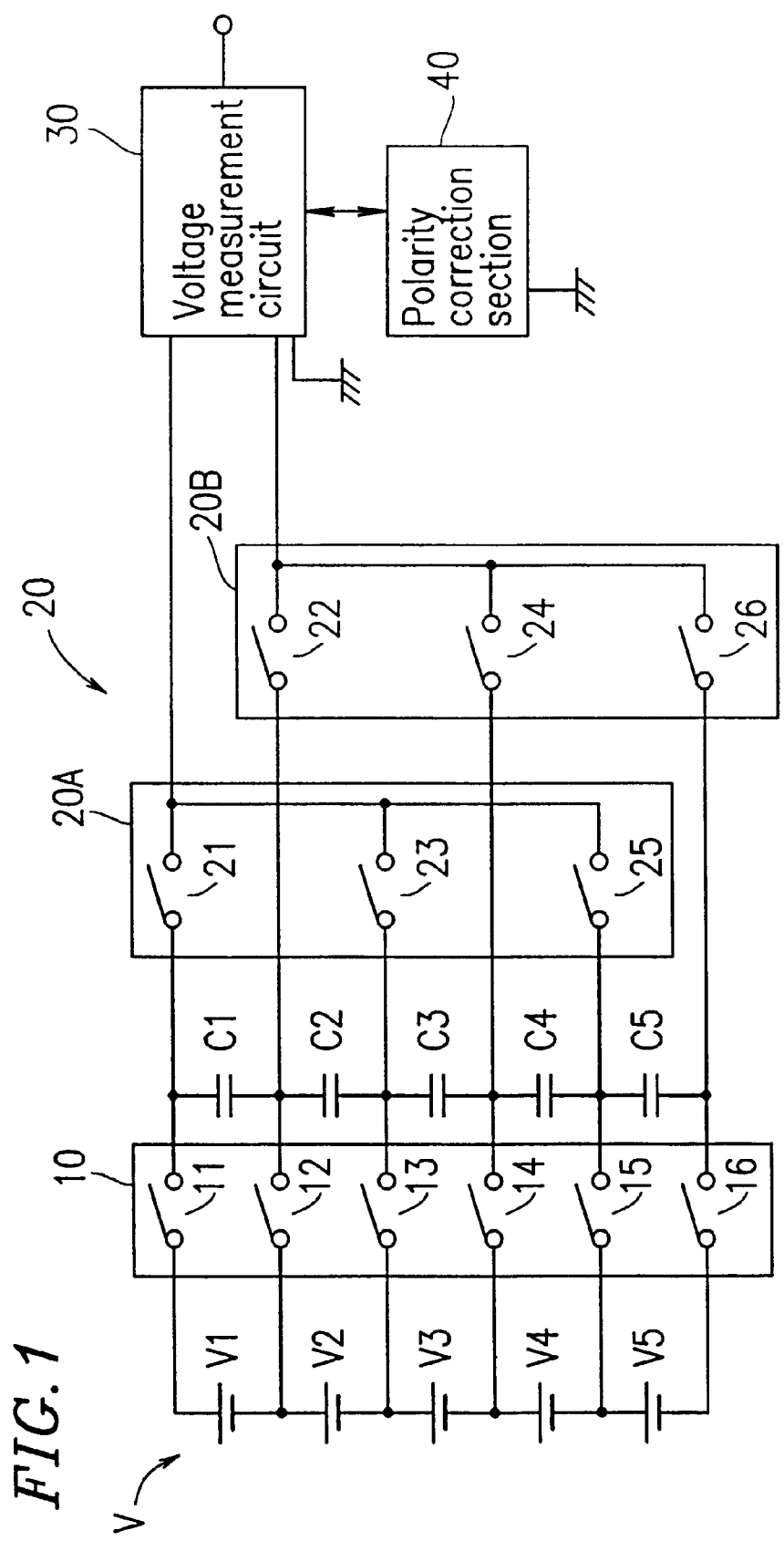
FIG. 1 is a circuit diagram showing a voltage measurement apparatus according to an example of the present invention.
Figure 2:
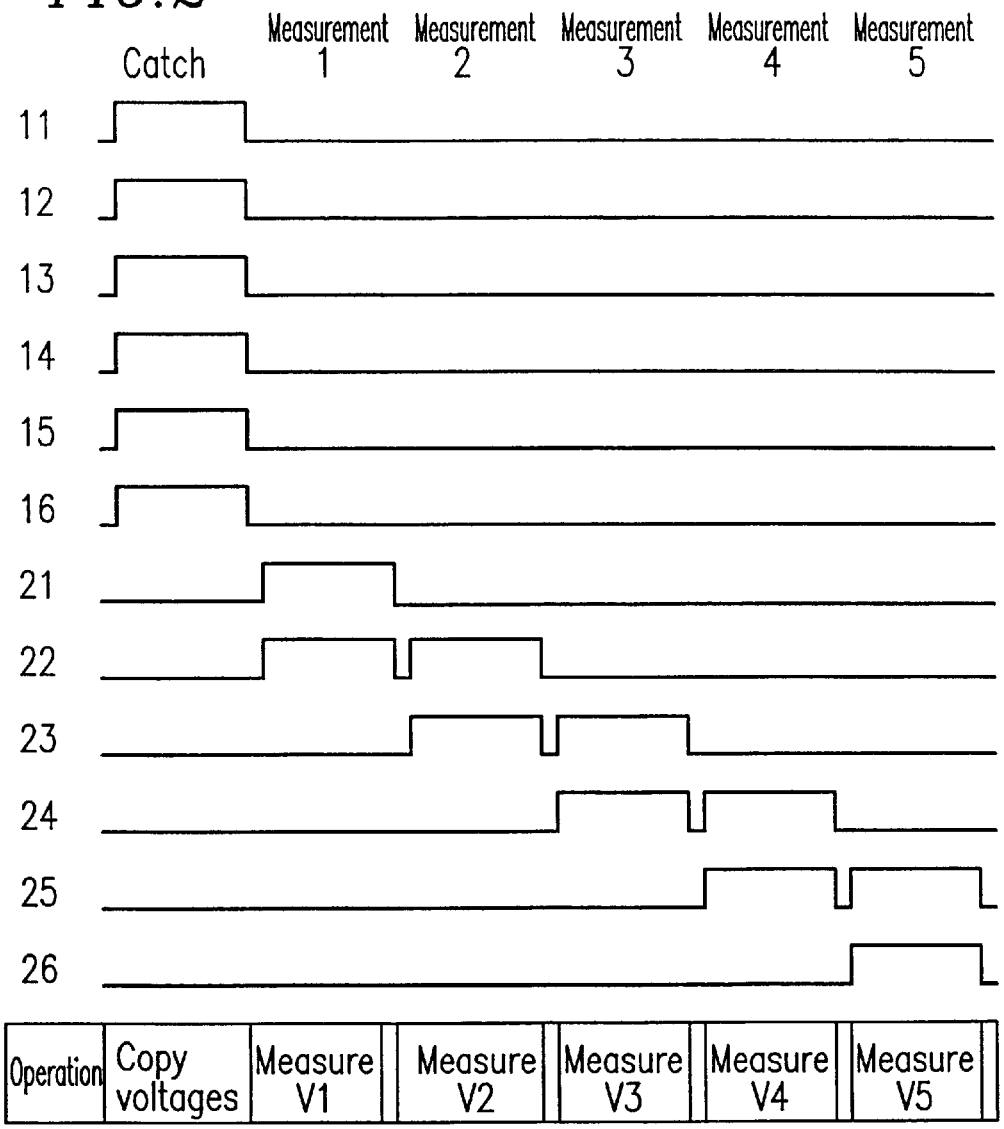
FIG. 2 is a timing chart for explaining an operation of the voltage measurement apparatus shown in FIG. 1.

FIG. 1 is a circuit diagram showing an exemplary voltage measurement apparatus according to the present invention. FIG. 2 is a timing chart of switching operations in the voltage measurement apparatus shown in FIG. 1.

The voltage measurement apparatus shown in FIG. 1 is used to measure the voltages of battery modules of a high-voltage battery V used in an electric vehicle, such as a HEV. The high-voltage battery V includes a plurality of cells connected in series which are divided into N battery modules, each including a predetermined number of cells connected in series. In this example, for the sake of clarification, the number of battery modules (power sources) is assumed to be five, and the high-voltage battery V includes five battery modules V1 to V5. The voltage measurement apparatus measures the voltage of each of the battery modules V1 to V5.

The voltage measurement apparatus includes: five (N) condensers C1 to C5 (capacitance elements) connected in series corresponding to the five battery modules V1 to V5, respectively; a first switching circuit 10 provided between a series circuit of the battery modules V1 to V5 and a series circuit of the condensers C1 to C5; a single voltage measurement circuit 30 for selectively measuring the voltage of each of condensers C1 to C5; a second switching circuit 20 provided between a series circuit of the condensers C1 to C5 and the voltage measurement circuit 30; and a polarity correction section 40 for selectively inverting the polarity of a voltage measured by the voltage measurement circuit 30.

The first switching circuit 10 includes six (N+1) sampling switches 11 to 16. Each sampling switch 11 to 16 is used to apply the voltage of the corresponding battery module V1 to V5 to the corresponding condenser C1 to C5.

The first sampling switch 11 is provided between one end of the series circuit of the five battery modules V1 to V5 and one end of the series circuit of the five condensers C1 to C5. The sixth sampling switch 16 is provided between the other end of the series circuit of the battery modules V1 to V5 and the other end of the series circuit of the condensers C1 to C5.

The second sampling switch 12 is provided between a connecting point between the first and second battery modules V1 and V2 connected in series, and a connecting point between the first and second condensers C1 and C2 connected in series.

Similarly, the third sampling switch 13 is provided between a connecting point between the second and third battery modules V2 and V3 connected in series, and a connecting point between the second and third condensers C2 and C3 connected in series. The fourth sampling switch 14 is provided between a connecting point between the third and fourth battery modules V3 and V4 connected in series, and a connecting point between the third and fourth condensers C3 and C4 connected in series. The fifth sampling switch 15 is provided between a connecting point between the fourth and fifth battery modules V4 and V5 connected in series, and a connecting point between the fourth and fifth condensers C4 and C5 connected in series.

The first to sixth sampling switches 11 to 16 are simultaneously controlled in such a manner as to be switched ON or OFF by control means (not shown) including a CPU, a timing generator, and the like, in accordance with a voltage measurement schedule.

The second switching circuit 20 provided between the series circuit of the first to fifth condensers C1 to C5 and the voltage measurement circuit 30 includes two multiplexers 20A and 20B. The first multiplexer 20A includes three switches 21, 23, and 25 which are connected to respective connecting points between the odd-numbered (i.e., first, third, and fifth) sampling switches 11, 13, and 15 in the first switching circuit 10, and the odd-numbered (i.e., first, third, and fifth) condensers C1, C3, and C5. Each switch 21, 23, and 25 is connected to one of a pair of input terminals of the voltage measurement circuit 30.

The second multiplexer 20B includes three switches 22, 24, and 26 which are connected to respective connecting points between the even-numbered (i.e., second, fourth, and sixth) sampling switches 12, 14, and 16 in the first switching circuit 10, and the odd-numbered (i.e., first, third, and fifth) condensers C1, C3, and C5. Each switch 22, 24, and 26 is connected to the other input terminal of the voltage measurement circuit 30.

The first and second multiplexers 20A and 20B are controlled using control means (not shown) including a CPU, a timing generator, and the like in the following manner. Every time the first to sixth sampling switches 11 to 16 in the first switching circuit 10 are switched from ON to OFF, one of the switches 21 to 26 is selectively switched ON in such a manner that the condensers C1 to C5 are sequentially connected to the voltage measurement circuit 30.

Whereas the high-voltage battery V including the battery modules V1 to V5 are electrically insulated from the chassis of a HEV carrying the high-voltage battery V, the voltage measurement circuit 30 is grounded to the chassis where the potential of the chassis is used as a reference potential to measure the voltage of each condenser C1 to C5.

An operation of the thus-constructed voltage measurement apparatus will be described with reference to a timing chart shown in FIG. 2.

In a HEV carrying the high-voltage battery V, the voltage of each battery module V1 to V5 in the high-voltage battery V is measured with predetermined cycles. The first to sixth sampling switches 11 to 16 in the first switching circuit 10, and the first to sixth switches 21 to 26 in the second switching circuit 20 are normally in an OFF state. At each time of voltage measurement, all of the sampling switches 11 to 16 in the first switching circuit 10 are simultaneously switched from OFF to ON.

In this case, the battery modules V1 to V5 are connected to the respective condensers C1 to C5 corresponding to the respective battery modules V1 to V5 in parallel. Therefore, the voltage of each battery module V1 to V5 is applied to the corresponding condenser C1 to C5. Each condenser C1 to C5 is charged by the voltage of the corresponding battery module V1 to V5, and the voltage of each condenser C1 to C5 corresponds to the voltage of the corresponding battery module V1 to V5. In this case, each switch 21 to 26 in the second switching circuit 20 is in the OFF state, and the series circuit of the condensers C1 to C5 is electrically insulated from the voltage measurement circuit 30.

When each condenser C1 to C5 has been charged for a predetermined time after all of the sampling switches 11 to 16 in the first switching circuit 10 were switched ON, all of the sampling switches 11 to 16 in the first switching circuit 10 are switched OFF, whereby the series circuit of the battery modules V1 to V5 is electrically insulated from the series circuit of the condensers C1 to C5.

In this situation, in the second switching circuit 20, the first switch 21 in the first multiplexer 20A and the second switch 22 in the second multiplexer 20B are switched ON. As a result, the positive-side terminal of the first condenser C1 is connected to one of the input terminals of the voltage measurement circuit 30 while the negative-side terminal of the first condenser C1 is connected to the other input terminal of the voltage measurement circuit 30. Here, the voltage measurement circuit 30 measures the absolute voltage of the first condenser C1.

After the voltage of the first condenser C1 is measured, the third switch 23 in the first multiplexer 20A and the second switch 22 in the second multiplexer 20B are switched ON. As a result, the negative-side terminal of the second condenser C2 is connected to one input terminal of the voltage measurement circuit 30 while the positive-side terminal of the second condenser C2 is connected to the other input terminal of the voltage measurement circuit 30. In this situation, the absolute voltage of the second condenser C2 is measured.

Thereafter, the third switch 23 in the first multiplexer 20A and the fourth switch 24 in the second multiplexer 20B are switched ON, thereby measuring the voltage of the third condenser C3. The fifth switch 25 in the first multiplexer 20A and the fourth switch 24 in the second multiplexer 20B are switched ON, thereby measuring the voltage of the fourth condenser C4. Further, the fifth switch 25 in the first multiplexer 20A and the sixth switch 26 in the second multiplexer 20B are switched ON, thereby measuring the voltage of the fifth condenser C5.

The first to fifth condensers C1 to C5 are simultaneously charged with the voltages of the respective battery modules V1 to V5 where currents flowing through the battery modules V1 to V5 are coincident with each other. Therefore, the voltages of the battery modules V1 to V5 can be accurately determined in sequence by sequentially measuring the voltages of the condensers C1 to C5.

In this case, the measured voltage values of the odd-numbered (i.e., first, third, and fifth) condensers C1, C3, and C5 have the polarity opposite to that of the measured voltage values of the even-numbered (second and fourth) condensers C2 and C4. However, the polarity of the measured voltage values of the even-numbered condensers C2 and C4 each are inverted by the polarity correction section 40. Therefore, the voltages of the condensers C1 to C5 have the same polarity.

The polarity correction section 40 may be a well-known circuit including a switch.

As described above, in the voltage measurement apparatus of the present invention, the number of switches provided between the series circuit of the battery modules V1 to V5 and the voltage measurement circuit 30 is a little more than two times as large as the number of battery modules V1 to V5. Therefore, the coincident voltages of the battery modules V1 to V5 can be measured using such small number of switches.

Figure 3:
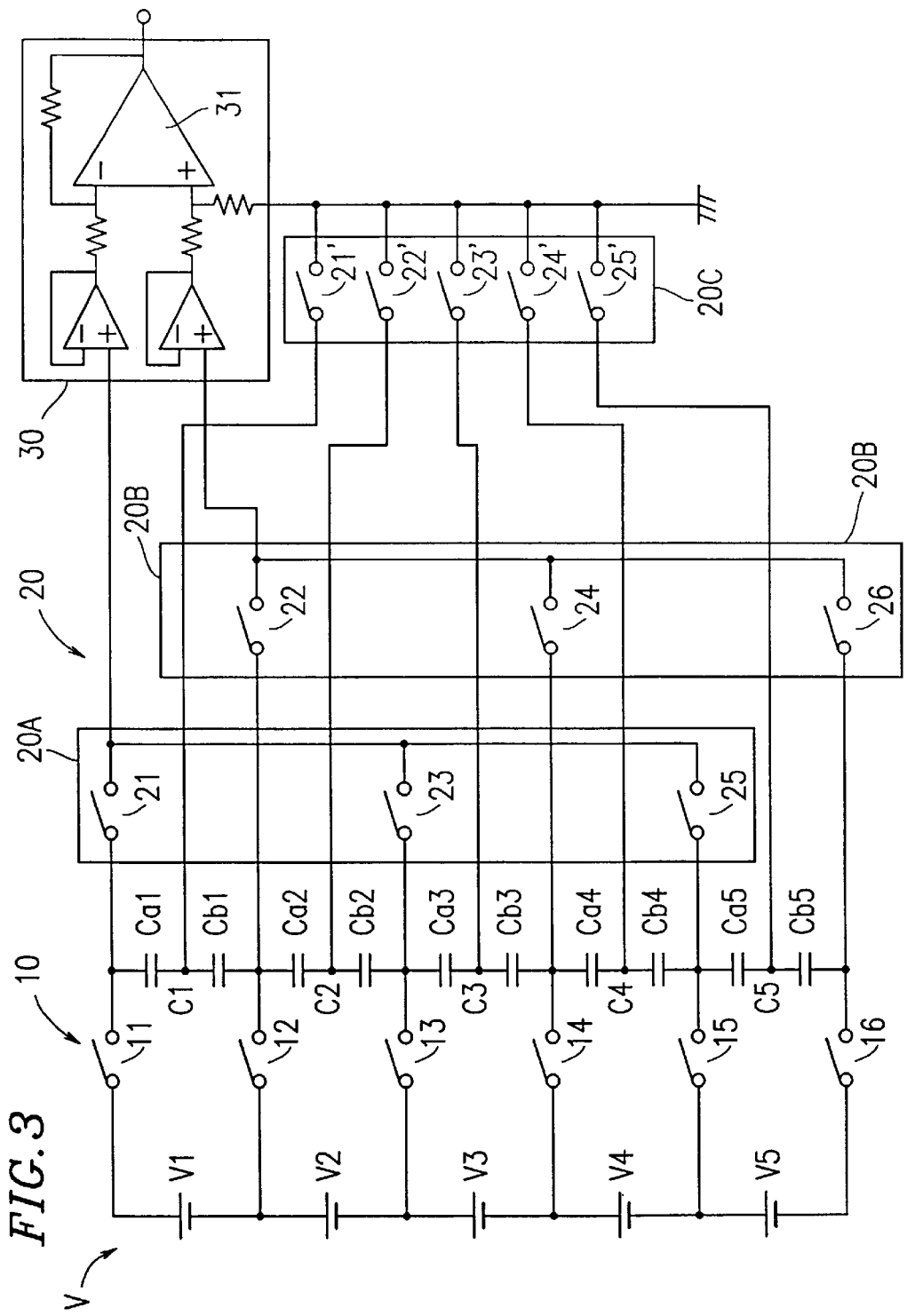
FIG. 3 is a circuit diagram showing a voltage measurement apparatus according to another example of the present invention.
Figure 4:
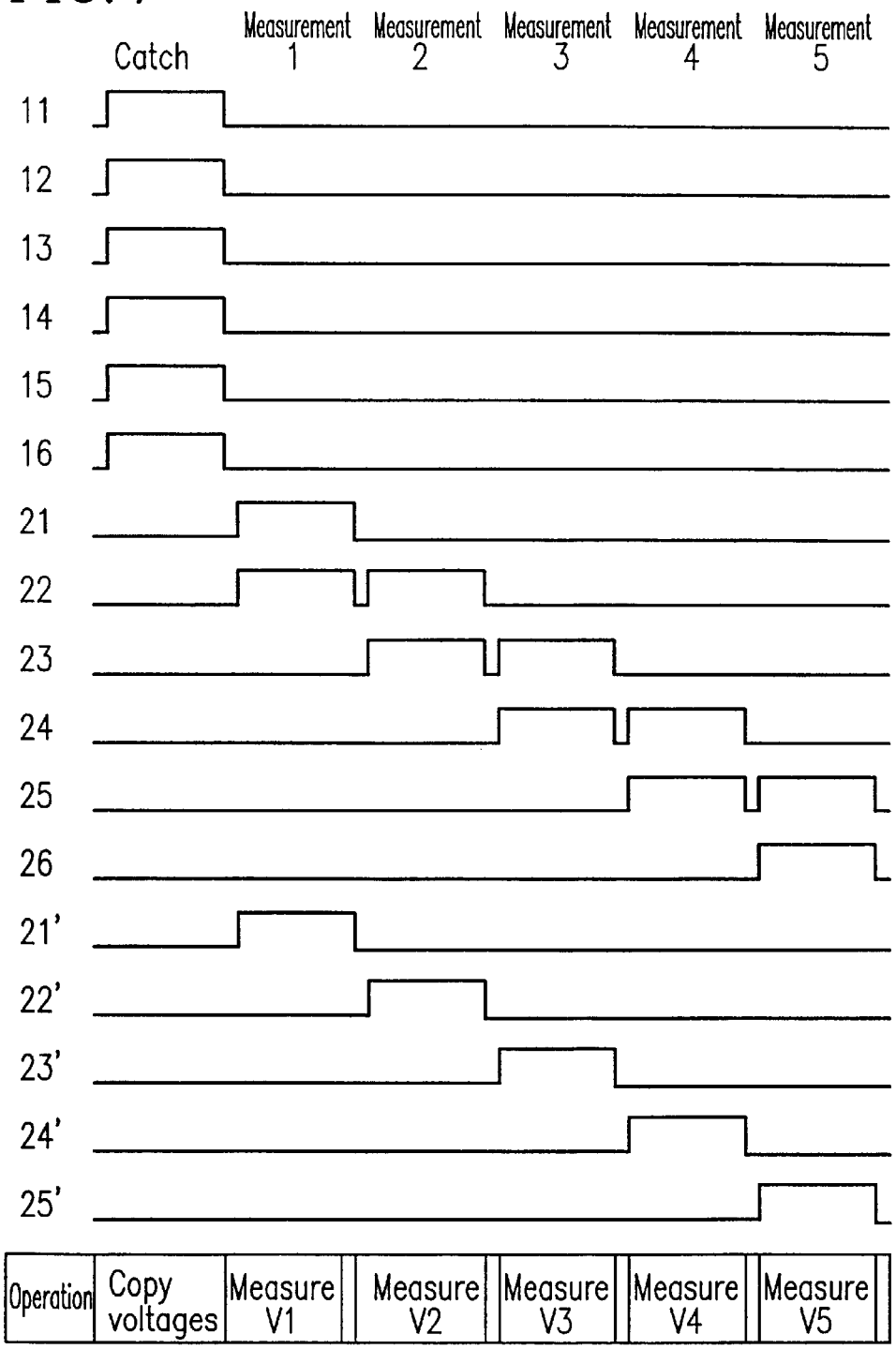
FIG. 4 is a timing chart for explaining an operation of the voltage measurement apparatus shown in FIG. 3.

FIG. 3 is a circuit diagram showing another exemplary voltage measurement apparatus according to the present invention. FIG. 4 is a timing chart showing a switching operation of the voltage measurement apparatus shown in FIG. 3.

The voltage measurement apparatus shown in FIG. 3 includes a plurality of pairs of condenser elements Ca1 and Cb1 to Ca5 and Cb5, which are connected in series, instead of the single condensers C1 to C5 as capacitance elements in the voltage measurement apparatus shown in FIG. 1. In each pair, the two condensers have the same capacitance.

A voltage measurement circuit 30 includes a differential input operational amplifier 31 having a reference voltage input terminal. Intermediate connecting points between the condenser elements Ca1 and Cb1 to Ca5 and Cb5 in the condensers C1 to C5 are connected via a third multiplexer 20C to the reference voltage input terminal of the voltage measurement circuit 30.

The third multiplexer 20C includes five switches 21' to 25' corresponding to the first to fifth condensers C1 to C5. The switches 21' to 25' are normally in an OFF state. Each switch 21' to 25' is switched ON when the opposite terminals of the corresponding condenser C1 to C5 is connected to a corresponding input terminal of the voltage measurement circuit 30. The switches 21' to 25' in the third multiplexer 20C are all connected to the reference voltage input terminal of the operational amplifier 31 in the voltage measurement circuit 30.

The remainder of the voltage measurement apparatus structure shown in FIG. 4 is similar to that of the voltage measurement apparatus shown in FIG. 1.

In the voltage measurement apparatus shown in FIG. 3, when one of the switches 21, 23, and 25 in a first multiplexer 20A and corresponding one of the switches 22, 24, and 26 in the second multiplexer 20B are in an ON state, the opposite terminals of the corresponding condenser C1 to C5 are connected to the respective input terminals of the voltage measurement circuit 30. The voltages of the condensers C1 to C5 are sequentially measured by the voltage measurement circuit 30 where the corresponding switch 21' to 25' is switched ON when the voltage of each condenser C1 to C5 is measured.

A leak current flows through each condenser C1 to C5 when the corresponding switch 21 to 26 in the second switching circuit 20 is switched ON. Such a leak current is attributed to the off-state capacitance of each switch 21 to 26, which is called common noise and may cause an error in a measured voltage value. The common noise can be reduced by switching switches 21' to 25' ON when the voltage of the respective condensers C1 to C5 are measured.

For example, if the switch 21' in the third multiplexer 20C is switched ON when the voltage of the first condenser C1 is measured, the intermediate connecting point between the condenser elements Ca1 and Cb1 constituting the first condenser C1 is connected to the reference voltage input terminal of the voltage measurement circuit 30. Therefore, leak currents caused by the off-state capacitance of each switch 21 and 22 symmetrically flow through the condenser elements Ca1 and Cb1 in opposite directions, and are applied as reference potentials to the voltage measurement circuit 30. In this situation, the voltages of the condenser elements Ca1 and Cb1 constituting the first condenser C1 are measured by the differential input operational amplifier 31 in the voltage measurement circuit 30, whereby the leak currents are canceled with each other and common noise is therefore reduced.

Similarly, common noise is reduced when the voltages of the second to fifth condensers C2 to C5 are each measured.

Therefore, in the exemplary voltage measurement apparatus, when the off-state capacitance of each switch in the switching circuit 20 is large, or high frequency noise is large, or the like, the voltages of the condensers C1 to C5 can be measured with high precision.

Figure 5:
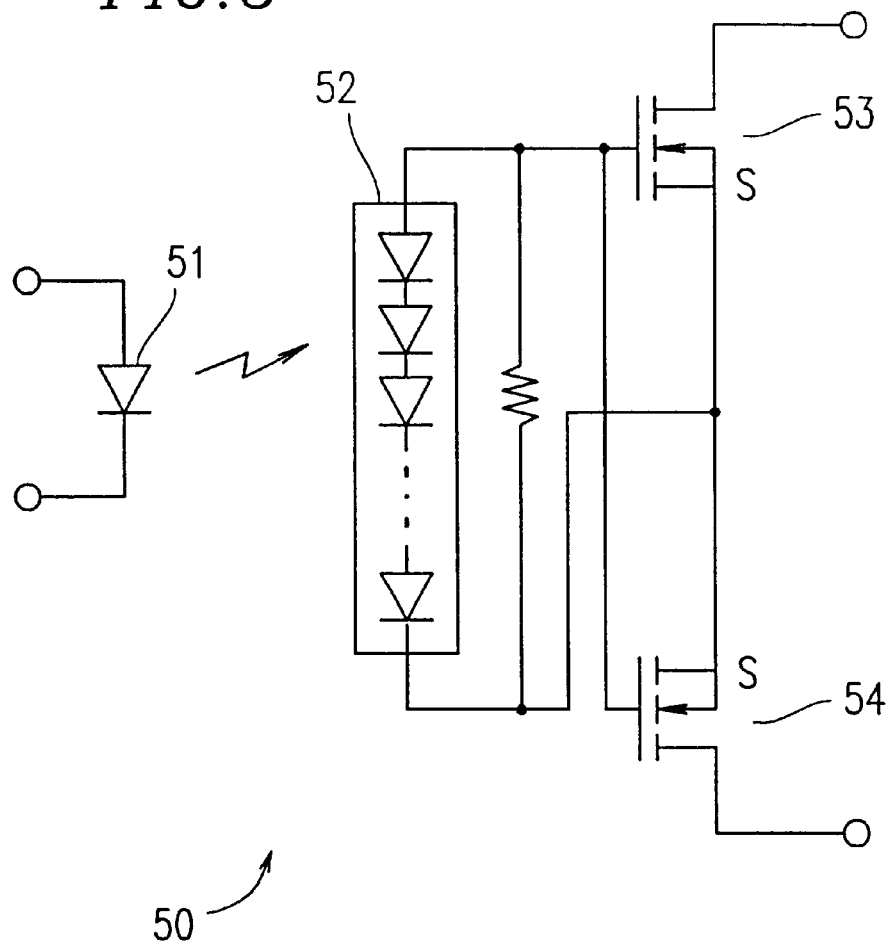
FIG. 5 is a circuit diagram showing a semiconductor relay element preferably used in the voltage measurement apparatus of the present invention.

FIG. 5 is a circuit diagram showing a semiconductor relay element which is preferably used as each sampling switch 11 to 16 constituting the first switching circuit, and each switch 21 to 26, and 21' to 25' constituting the second switching circuit 20 in the voltage measurement apparatus of the present invention.

The semiconductor relay element 50 includes an LED 51 as a light emitting element and a photoelectric element 52 which receives a light signal from the LED 51. An output of the photoelectric element 52 causes a pair of MOS transistors 53 and 54 to be switched ON. In such a semiconductor relay element 50, the LED 51 and the photoelectric element 52 can be insulated from each other. Therefore, a signal can be transmitted and received between the high-voltage battery V which is insulated from the chassis of a HEV and the voltage measurement circuit 30 which is grounded to the chassis even when they are electrically insulated from each other.

Further, the semiconductor relay element 50 has an excellent switching property, such as breakdown strength and low on-state resistance. Therefore, the semiconductor relay element 50 can be preferably used as each sampling switch 11 to 16 constituting the first switching circuit 10 and each switch 21 to 26 and 21' to 25' constituting the second switching circuit 20.

The semiconductor relay element 50 having a structure as described above has a high level of off-state capacitance. However, when used as each switch 21 to 26 in the second switching circuit 20, the above-described configuration of the voltage measurement apparatus can preferably reduce common noise due to off-state capacitance.

In this example, although a condenser is used as a capacitance element, the present invention is not limited to this. Any type of capacitance element may be used which can obtain a voltage corresponding to the voltage of each battery module.

In the voltage measurement apparatus of the present invention, a capacitance element corresponding to each of a plurality of power sources connected in series is simultaneously charged to a voltage corresponding to the voltage of each power source. Therefore, even when the value of a current flowing through a plurality of power sources connected in series varies, the voltage of each power source saved at the time when coincident currents flowed through the power source can be measured. Therefore, the voltage of each power source can be measured to detect abnormality or the like of each power source with high precision.

Various other modifications will be apparent to, and can be readily made, by those skilled in the art without departing from the scope and spirit of this invention. Accordingly, it is not intended that the scope of the claims appended hereto be limited to the description as set forth herein, but rather that the claims be broadly construed.

What is claimed is:

1. A voltage measurement apparatus for measuring a voltage of each of N power sources connected in series, the apparatus comprising:

N capacitance elements provided respectively corresponding to the N power sources, and connected in series;

a first switching section for simultaneously applying a voltage of each power source to one of the N capacitance elements corresponding to said power source;

a voltage measurement section for measuring a voltage of each capacitance element; and a second switching section for sequentially connecting each capacitance element to the voltage measurement section.

2. A voltage measurement apparatus according to claim 1, wherein the first switching section includes:

two sampling switches provided between terminals of a circuit including the N power sources connected in series, and corresponding terminals of a circuit including the N capacitance elements connected in series; and N−1 sampling switches, each provided between an interface portion between a corresponding pair of power sources connected in series, and an interface portion between a corresponding pair of capacitance elements connected in series, and the N+1 sampling switches are simultaneously switched ON or OFF.

3. A voltage measurement apparatus according to claim 1, wherein the second switching section includes:

a first multiplexer including a switch connected between a positive-side terminal of each odd-numbered capacitance element of the N capacitance elements connected in series, and one of a pair of input terminals of the voltage measurement section; and a second multiplexer including a switch connected between a positive-side terminal of each even-numbered capacitance element of the N capacitance elements connected in series, and the other of the pair of input terminals of the voltage measurement section, and one of the switches in each multiplexer is simultaneously selected and switched ON or OFF in such a manner that the N capacitance elements are sequentially connected to the voltage measurement section.

4. A voltage measurement apparatus according to claim 1, wherein the voltage measurement section is connected to a polarity correction section for inverting a polarity of a voltage to be measured.

5. A voltage measurement apparatus according to claim 1, wherein: the each capacitance element includes a pair of capacitance sub-elements; the voltage measurement section is of a differential input type; and the second switching section includes a third multiplexer for selectively connecting an intermediate connecting point between the pair of capacitance sub-elements connected to the voltage measurement section to a reference potential of the voltage measurement section.

6. A voltage measurement apparatus according to claim 1, wherein each sampling switch in the first switching section includes a semiconductor relay element for driving a MOS transistor using a light signal.

7. A voltage measurement apparatus according to claim 1, wherein each switch in the second switching section includes a semiconductor relay element for driving a MOS transistor using a light signal.

* * * * *